United States Patent [19]

Hara

[11] 4,319,209

[45] Mar. 9, 1982

[54] FINE TUNING COIL HAVING STEEL WIRE FORMING COIL PORTION

[75] Inventor: Toshiwo Hara, Soma, Japan

[73] Assignee: Alps Electric Co., Ltd., Tokyo, Japan

[21] Appl. No.: 156,591

[22] Filed: Jun. 5, 1980

[30] Foreign Application Priority Data

Jun. 6, 1979 [JP] Japan .................................. 54-76769

[51] Int. Cl.$^{3}$ .................................................. H03J 3/04

[52] U.S. Cl. ........................................ 334/74; 336/136

[58] Field of Search .................................... 334/74–77; 336/136, 179, 221, 222, 229

[56] References Cited

U.S. PATENT DOCUMENTS

| | | | |
|---|---|---|---|
| 2,100,412 | 11/1937 | Scott | 336/179 X |
| 2,416,393 | 2/1947 | Huckleberry | 336/179 |
| 3,771,079 | 11/1973 | Kawasaki et al. | 334/74 X |

*Primary Examiner*—Paul L. Gensler

*Attorney, Agent, or Firm*—Guy W. Shoup; Gerard F. Dunne

[57] ABSTRACT

A fine tuning coil for use in a local oscillator of a tuner, which is made of a high-tension steel wire or a so-called piano wire. The wire has a diameter which is smaller than that of the conventionally used copper wires, and is loosely wound.

4 Claims, 2 Drawing Figures

FINE TUNING COIL HAVING STEEL WIRE FORMING COIL PORTION

BACKGROUND OF THE INVENTION

1. Field of the Invention

The present invention relates to a coil of a local oscillator in a tuner, and more specifically to a fine tuning coil for adjusting the oscillation frequency of a local oscillator.

2. Prior Art

The local oscillation circuit of a tuner has been equipped with a plurality of oscillation coils to produce oscillation frequencies which correspond to a plurality of channels that will be received. In addition to these coils, there have also been provided coils for fine tuning to precisely adjust the oscillation frequencies. The coil for fine tuning usually consists of a copper wire of a diameter of about 0.5 mm coated with urethane, which is densely wound maintaining an inner diameter of about 5 mm. The coil is then solidified with an adhesive agent. The coil further movably accommodates a core member therein.

Fine tuning is effected by inserting the core member into, or taking it out from, the coil.

Usually, however, the coil for fine tuning consists of a covered wire which is densely wound, and, therefore, easily absorbs moisture among the neighboring wires. Therefore, stray capacitances often developed among the wires and these capacitances vary so that the coil oscillates at varying frequencies. It is therefore desired to provide a fine tuning coil having excellent characteristics against humidity. To prevent the characteristics of the fine tuning coil from being deteriorated by humidity, gaps between the wires may be increased to reduce the stray capacitances which principally stem from the absorbed moisture. This, however, means that the coil may not be as densely wound. To obtain the same inductance as that of the densely wound fine tuning coil, therefore, the size of the coil is inevitably increased. When not densely wound, furthermore, the coil tends to be easily affected by possible vibration when the tuner is subjected to vibration, giving rise to the occurrence of howling.

SUMMARY OF THE INVENTION

The object of the present invention therefore is to provide a coil for fine tuning, which has excellent resistance against humidity.

Another object of the present invention is to provide a small coil for fine tuning.

A further object of the present invention is to provide a coil for fine tuning, which can be firmly mounted and which develops little howling when subject to vibration.

For these purposes, according to the present invention, a high-tension steel wire or a so-called piano wire is used having a wire diameter which is considerably smaller than that of the conventionally employed copper wires, and the wire is loosely wound to form a coil.

Further objects and advantages of the present invention will become obvious from the following description of an embodiment in conjunction with the accompanying drawings.

DESCRIPTION OF THE PREFERRED EMBODIMENT

Figure 1:
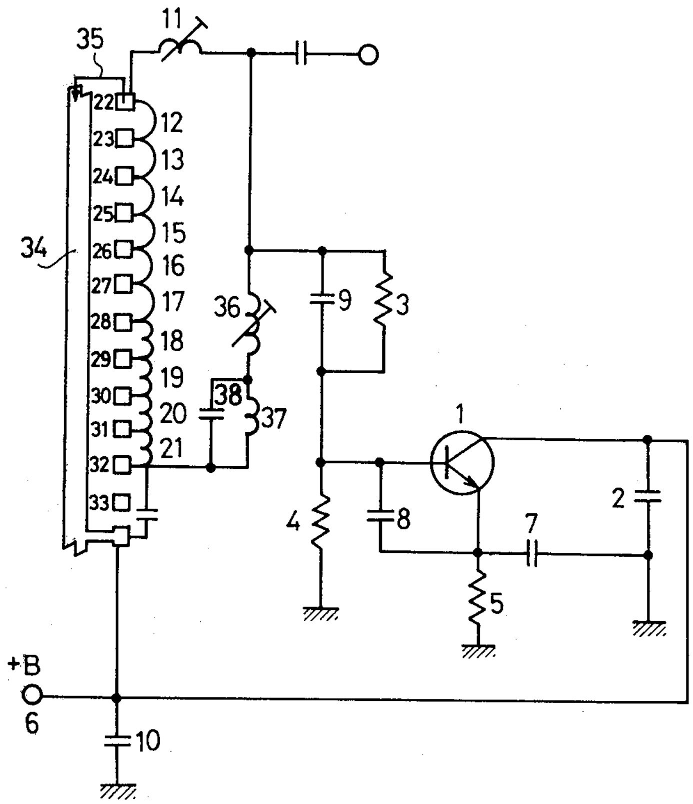
FIG. 1 is a circuit diagram of a local oscillator employed for the tuners.

The circuit of a local oscillator of a tuner is generally constructed as shown in FIG. 1. The collector of a transistor 1 is grounded through a capacitor 2. Resistors 3 to 5 work to apply a biasing voltages, and the electric power is introduced through a power supply terminal 6. The oscillator has an output capacitor 7 and a feedback capacitor 8 to oscillate, and further has a resonance capacitor 9 to establish a so-called Clapp oscillator. A bypass capacitor 10 is connected to the power supply terminal 6 to prevent the oscillation energy from being leaked. The inductance corresponding to the channel being received is changed by an inductance 11 in the case of the channel 12. In the channel 11 and in the channels of smaller numbers, inductances 12 to 21 connected to the contacts 22 to 32 are successively changed by a slider 35 which connects an electrically conductive plate 34 to any one of the contacts 22 to 33.

In this case, in order that fine tuning can be manually accomplished, a series circuit consisting of a fine tuning coil 36 and a parallel circuit of an auxiliary coil 37 for resonance and a capacitor 38 for resonance, is connected in parallel with the inductances 11 to 21.

Figure 2:
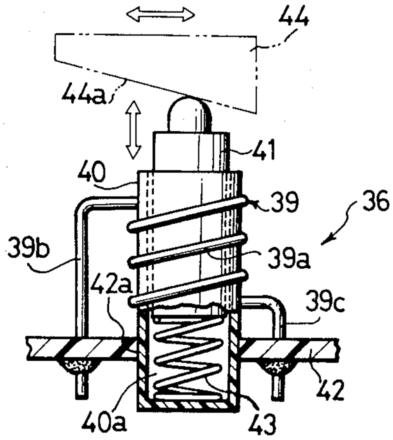
FIG. 2 is a diagram illustrating a coil for fine tuning.

With reference to FIG. 2, the fine tuning coil 36 consists of a coil 38, a core accommodation member 40, a core 41 and a spring 43. The coil 39 consists of a wound portion **39*a* in which a wire is wound loosely in a plurality of turns, a first end 39*b* and a second end 39*c* which extend from respective ends of the wound portion 39*a* in the lengthwise direction of the core accommodation member 40. The first end 39*b* and the second end 39*c* are soldered to corresponding patterns which are formed on the back surface of a printed board 42 of a tuner. The coil 39 is made of high-tension steel wire, i.e., made of a piano wire. The piano wire usually has resiliency. Therefore, when wound in the form as shown in FIG. 2**, the piano wire springs back owing to its resiliency so that the diameter of the coil is increased. Accordingly, when it is desired to obtain a coil of an inner diameter of, for example, 5.5 mm, the wire should be wound to form a smaller diameter by taking this springing back into account.

The core accommodation member 40 consists of a cylinder made of a resin containing a glass fiber, has a hollow portion **40*a*, and is forcibly fitted to a through hole 42*a* which is formed in the board 42, and is held by a suitable adhesive agent. The core 41 is inserted in the hollow portion 40*a* of the core accommodation member 40 to slide in the upper and lower directions, and is urged at all times toward the upper direction by the spring 43 which is placed on the bottom of the hollow portion 40*a*. The upper end of the core 41 is always in contact with a cam surface 44*a* of a fine adjustment lever 44. By moving the lever 44 in the right and left directions of the drawing, therefore, the core 41 can be moved up and down to change the inductance of the coil 43**.

The coil 36 according to the embodiment of the present invention is formed by winding a piano wire of a diameter of 0.2 mm to about 0.3 mm in about 12 turns maintaining a pitch of 0.6 mm to 0.7 mm between the centers of the neighboring turns. When a fine tuning coil having resistance against the moisture comparable to that of the embodiment of the present invention is formed by using an urethane-covered copper wire which has been widely used to make coils, the diameter of the copper wire must be greater than 0.5 mm if it is attempted to maintain a pitch of 0.6 mm to 0.7 mm between the centers of the neighboring wires. This is because, since the copper wire is a low-tension wire, the shape of the coil made of a copper wire of a diameter of smaller than 0.5 mm is subject to be easily deformed upon receipt of even slight shocks. Moreover, to obtain the same inductance, the shape of the whole coil made of a wire having increased diameter tends to become bulky. In addition, the copper wire which is a low tension wire is subject to be affected by vibration to give rise to the occurrence of howling. If the coil is solidified with an adhesive agent, the result is the diminished humidity-resistant characteristics.

According to the present invention which employs a high tension steel wire or a piano wire to form the coil, the diameter of the wire can be reduced to increase the gap between the neighboring wires. Furthermore, the coil exhibits increased resistance against the external vibration. It should further be noted that the present invention permits a variety of design modifications without deparating from the scope of the claims.

What is claimed is:

1. A fine tuning coil for use in a local oscillator circuit of a tuner, comprising: a hollow core accommodation member; a core member extending within said core accommodation member to move therewithin; spring means accommodated in the hollow portion of said core accommodation member to urge said core member in a given direction; and a coil consisting of a wound portion having a plurality of turns and wound about the outer periphery of said core accommodation member, said coil being made of a steel wire wound about said core accommodation member with sufficient space between adjacent turns to reduce the moisture absorbable by the coil and having a reduced thickness to increase the number of turns attained per unit length of the coil.

2. A fine tuning coil according to claim 1, the respective end portions of said coil extending in a direction parallel to the longitudinal axis of said coil and being adapted to be connected electrically to circuit patterns on a printed circuit board.

3. A fine tuning coil according to claim 1, wherein said steel wire has a diameter of from about 0.2 mm to about 0.3 mm.

4. A fine tuning coil according to claim 3, wherein said steel wire is wound to maintain a pitch of 0.6 mm to 0.7 mm between adjacent centers of turns.

* * * * *